United States Patent

Boardman et al.

[11] Patent Number: 5,872,458
[45] Date of Patent: *Feb. 16, 1999

[54] METHOD FOR ELECTRICALLY CONTACTING SEMICONDUCTOR DEVICES IN TRAYS AND TEST CONTACTOR USEFUL THEREFOR

[75] Inventors: Keith Alan Boardman, Austin; John Darrell Redden, Round Rock, both of Tex.

[73] Assignee: Motorola, Inc., Schaumburg, Ill.

[ * ] Notice: This patent issued on a continued prosecution application filed under 37 CFR 1.53(d), and is subject to the twenty year patent term provisions of 35 U.S.C. 154(a)(2).

[21] Appl. No.: 676,771

[22] Filed: Jul. 8, 1996

[51] Int. Cl.$^6$ .................................................. G01R 31/02
[52] U.S. Cl. ........................................ 324/758; 324/755
[58] Field of Search .................................. 324/755, 754, 324/758, 757

[56] References Cited

U.S. PATENT DOCUMENTS

| | | | |
|---|---|---|---|
| 4,996,476 | 2/1991 | Balyasny et al. | 324/754 |
| 5,151,651 | 9/1992 | Shibata | 324/754 |
| 5,172,049 | 12/1992 | Kiyokawa et al. | 324/760 |
| 5,180,971 | 1/1993 | Mitchell et al. | 324/755 |
| 5,208,529 | 5/1993 | Tsurishima et al. | 324/755 |
| 5,227,717 | 7/1993 | Tsurishima et al. | 324/755 |
| 5,481,202 | 1/1996 | Frye, Jr. | 324/754 |
| 5,492,223 | 2/1996 | Boardman et al. | 206/710 |

Primary Examiner—Ernest F. Karlsen
Attorney, Agent, or Firm—Patricia S. Goddard; Jeffrey S. Abel

[57] ABSTRACT

Semiconductor devices (140, 410, 610) are tested or burned-in while in a handling or shipping tray (100, 500, 700) using a test contactor (150, 450, 750, 850, 950) which engages either a cell (120, 520, 720) of the tray or the device itself during testing. A tray having a plurality of devices is moved by a handling system in an initial alignment operation where one or more devices is generally aligned beneath the test contactor. Then, the tray or the test contactor is moved in a vertical direction so that engagement features of the test contactor engage either the tray cell or the device to be tested to bring the device into final alignment for testing. Upon final alignment, contacts (152, 452, 752, 852, 952) of the test contactor physically and electrically contact leads (141, 414, 614) and in-tray testing of the devices is performed. In-tray testing reduces manufacturing cycle and minimizes device lead damage by eliminating pick and place handling of the devices at test.

21 Claims, 7 Drawing Sheets

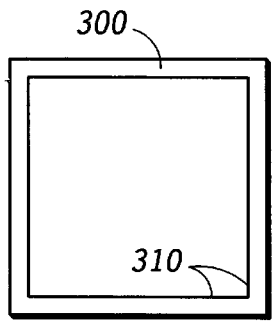
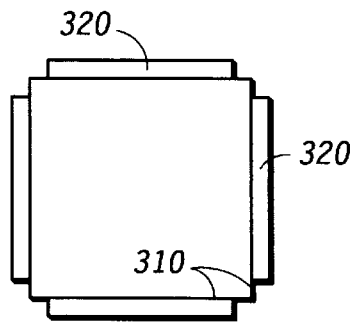
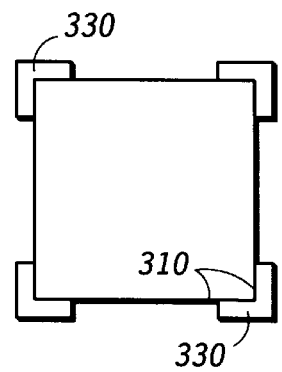
*FIG.6*  *FIG.7*  *FIG.8*
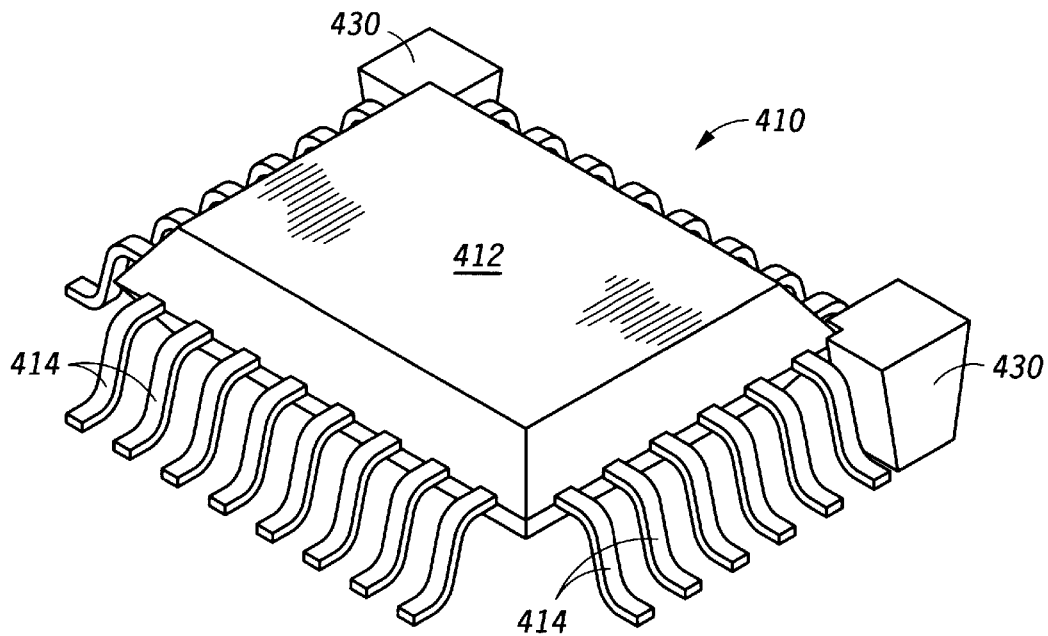
*FIG.9*

5,872,458

METHOD FOR ELECTRICALLY CONTACTING SEMICONDUCTOR DEVICES IN TRAYS AND TEST CONTACTOR USEFUL THEREFOR

FIELD OF THE INVENTION

The present invention relates generally to methods of making electrical contact to semiconductor devices for purposes such as testing and burn-in, and more particularly to such methods when semiconductor devices are housed in trays, such as shipping trays and handling trays.

BACKGROUND OF THE INVENTION

Many varieties of packaged semiconductor devices and multi-chip modules (MCMs) are currently handled and shipped in molded plastic trays. Semiconductor manufacturers sometimes use molded plastic or metallic trays or pallets for processing of semiconductor devices. The majority of these devices are handled and shipped in trays or pallets because the package leads would be damaged if the packaged devices were handled or shipped in other container types. These trays, regardless of material type or intended use, all hold individual die, partially packaged or completely packaged devices in a regular matrix of individual cells. The trays come in several outline geometries and thicknesses and are sometimes known as "waffle packs." The most popular and widely used trays have a common outline and standard cell matrix patterns that are specified by widely accepted industry standards.

When trays for devices first came into regular use, semiconductor processing equipment was developed that removed individual packaged devices from the tray, moved the device through one or more processing steps and then returned the device to the same or a similar tray. This equipment is popularly known as "pick and place" equipment and is used throughout the industry. The pick and place method of device handling has a number of drawbacks. Each movement can introduce a potential for damage to the delicate device leads. Moving individual devices is also inherently slower than moving groups of devices. Establishing and maintaining alignment of the packaged devices so that the package can be presented in the correct orientation to the processing site is also a challenge. Equipment often requires customized hardware kits for each device package variation. Such kits are often expensive and require significant storage space when not in use.

Newer semiconductor processing equipment designs take advantage of the orderly and regular arrangement of devices in the trays or pallets to largely eliminate individual package handling. The entire tray or pallet is presented to the processing site and the individual packaged devices remain in the tray during processing. This method of processing is popularly known as "in-tray." In-tray processing is gaining acceptance in areas including attachment of solder balls to ball grid array (BGA) packages, encapsulation of semiconductor die in array packages, and device marking. In-tray processing is also gaining wide acceptance for device package lead and mark inspection. Unfortunately, the testing and burning-in of semiconductor devices is currently still restricted to pick and place processing. All existing processing equipment for the presentation of devices to an electrical test system or for the loading and unloading of devices into and from thermal or electrical stressing (burn-in) equipment is of the pick and place variety. These operations represent the highest potential for device lead damage. Electrical test equipment is extremely expensive and utilization rates suffer due to the inherent slowness of pick and place equipment handling individual devices.

Accordingly, a need exists in the industry for method for testing, burning-in, or otherwise electrically contacting semiconductor devices while in-tray. Such a method would reduce device lead damage and increase throughput as compared to current testing and burn-in methods.

BRIEF DESCRIPTION OF THE DRAWINGS

FIGS. 6–8 illustrate a variety of ways in which test contact engagement features can engage either a tray cell or a semiconductor device, for example either around the full perimeter of the device or cell (FIG. 6), along the sides of the device or cell (FIG. 7), or at the corners of the device or cell (FIG. 8).

FIG. 9 illustrates in a perspective view how corner engagement features of a test contactor can engage corners of a semiconductor device in accordance with a method for in-tray testing the device of the present invention.

DETAILED DESCRIPTION OF A PREFERRED EMBODIMENT

Generally, the present invention defines a method for testing and burning-in packaged semiconductor devices, including multichip modules (MCMs) while the devices remain safely in the tray or pallet used to carry or ship the devices (i.e. "in-tray"). As part of the invention, there is provided an electrical contactor designed to make electrical contact to the devices while in-tray. A variety of preferred contactor design features are herein disclosed which are suitable for use with in-tray test and burn-in. The advantages of in-tray processing for functional test and burn-in in accordance with the invention include improved processing speed, reduction or possibly elimination of damage to device leads, reduced handling equipment size, increased loading density of burn-in equipment, and the elimination of hardware kits for test and burn-in handling equipment.

Figure 1:
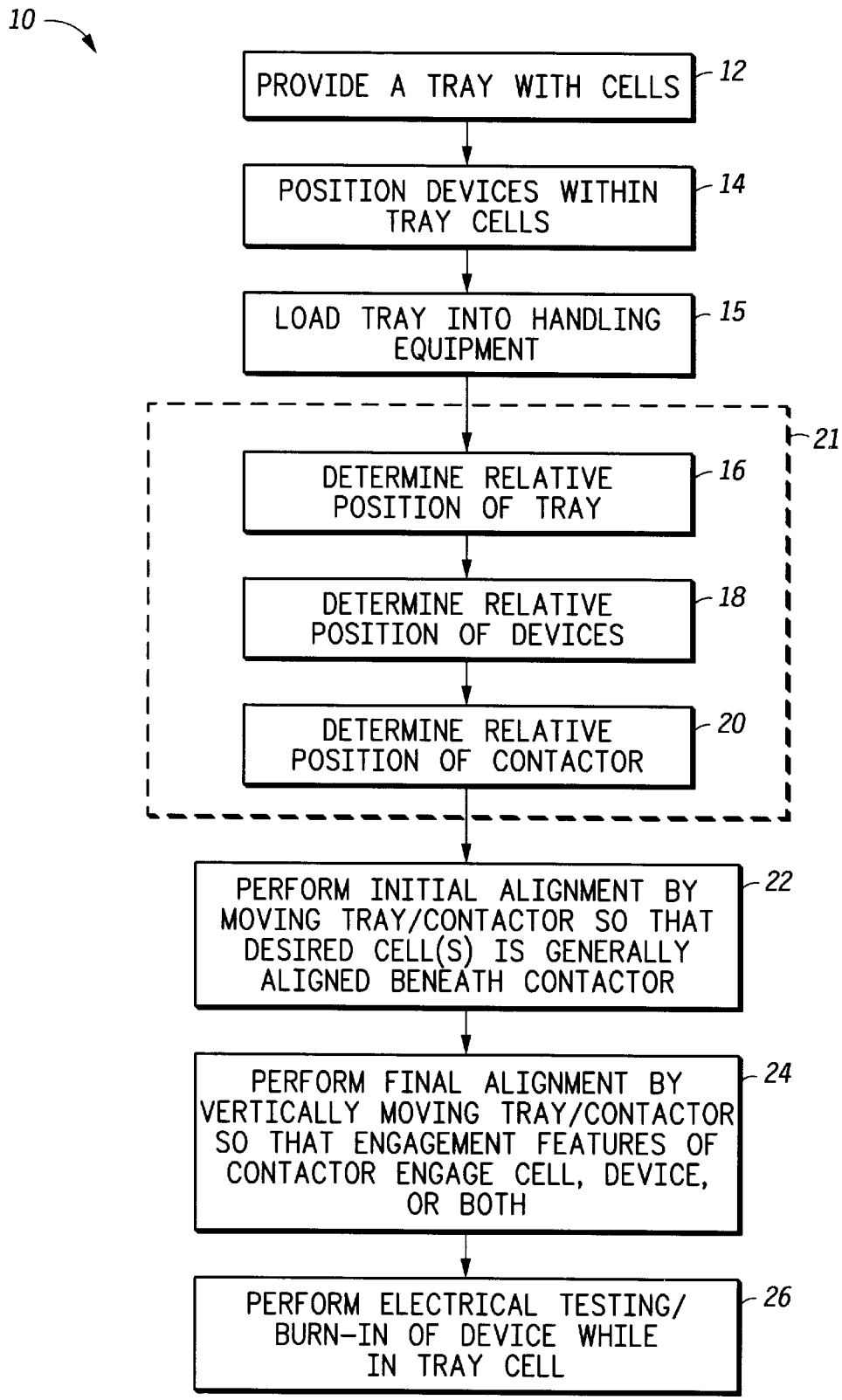
FIG. 1 is a process flow for testing semiconductor devices in-tray in accordance with an embodiment of the present invention.
Figure 2:
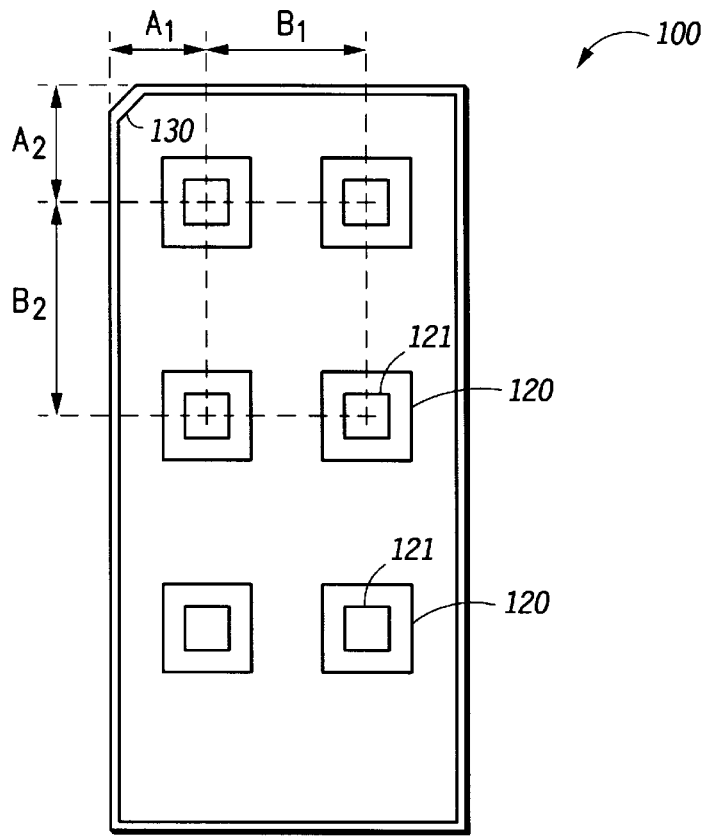
FIG. 2 is a top-down view of a shipping or handling tray suitable testing semiconductor devices in-tray in accordance with the present invention.

These and other features, and advantages, will be more clearly understood from the following detailed description taken in conjunction with the accompanying drawings. It is important to point out that the illustrations may not necessarily be drawn to scale, and that there may be other embodiments of the present invention which are not specifically illustrated. It is also noted that like reference numerals may be used to designate identical or corresponding parts throughout the several views A process to electrically contact a semiconductor device while in-tray in accordance with one embodiment of the present invention is outlined in a process flow 10 of FIG. 1. To better understand the various steps in process flow 10, reference will be made to subsequent figures. A first step 12 in process flow 10 is to provide a tray having a plurality of cells for receiving semiconductor devices. A top view of a typical handling or shipping tray suitable for practicing the present invention is illustrated in FIG. 2. As illustrated, a tray 100 includes a plurality of cells 120 arranged in a matrix configuration. While six cells are illustrated, in practice tray 100 is likely to have many more cells. Within each cell is a hole or opening 121, however not all cells of trays need include such opening. The openings are provided generally to aid in the manufacturability and ultimate cost of the tray (e.g. reduce material), but can also be included to permit physical access to the device within each cell. Tray 100 also includes an orientation marker 130, illustrated as a clipped corner, which enables tray handling equipment to determine the orientation of the tray.

In many instances, the design of tray 100 will be in accordance with accepted industry standards. For example, the spacing of the cells to tray edges (e.g. dimensions A1 and A2) and the spacing between cells (e.g. dimensions B1 and B2) will be controlled for a particular device type to be handled in the tray. These standard dimensions are useful for practicing the present invention because the dimensions can be used to accurately engage an electrical contactor with a device within a cell for in-tray testing or burn-in, as further explained below.

In a preferred embodiment of the present invention, the tray design for performing in-tray test and burn-in is one having engagement features for each cell in the tray. A variety of such tray designs are described and illustrated in U.S. Pat. No. 5,492,223, entitled, "Interlocking and Invertible Semiconductor Device Tray and Test Contactor Mating Thereto," assigned to the assignee hereof, and herein incorporated by reference. The trays described in U.S. Pat. No. 5,492,223 utilize engagement features which enable the trays to be stacked on top of one another so that the trays can be shipped or handled while ensuring that the devices are kept within their designated cell. The engagement features associated with each cell of the trays insure proper and adequate mating of the stacked trays to minimize device movement and thereby lessen the chances of device lead damage. For the purposes of in-tray testing in accordance with the present invention, these engagement features can be used to help align an electrical contactor to the tray cell and the device within the cell for proper electrical contact. While a preferred method of practicing the present invention utilizes trays having cell-based engagement features, it is important to realize that the present invention can be used in conjunction with conventional shipping and handling trays which simply interlock or engage other trays around a perimeter of the entire tray.

After providing the tray, a plurality of semiconductor devices are positioned in the cells of tray 100 in accordance with a step 14 of process flow 10. Each cell 120 is intended to contain one semiconductor device, albeit that device can itself include several individual semiconductor die, such as in an MCM device. Many current configurations of semiconductor device packages are commonly handled and shipped in such matrix trays. Examples of the packages commonly processed and shipped in trays include the gull-wing-leaded quad flat package (QFP), the pin grid array (PGA), the ball or bump grid array (BGA), the column grid array (CGA), the pad array carrier (PAC), the plastic leaded chip carrier (PLCC), and the thin small outline package (TSOP). Each of these package types can be in-tray tested in accordance with the present invention.

Once the semiconductor devices are positioned within the tray cells, the tray is loaded into a handler which will carry the tray through the testing operation, as indicated by a step 15 of process flow 10. As used herein, "testing" generally refers to any manufacturing operation on a semiconductor device which requires electrical contact to be made to the device leads or terminals. For example, final functional test of a device requires electrical contact to be made to the device leads. Likewise, "burn-in" of a device requires electrical contact to the device leads.

Once the tray is loaded, the handling equipment determines the orientation and position of the tray. In reference to process flow 10, this step is represented as a step 16. For example, pressure contact sensors or optical sensors can be used to find the tray edges relative to known handling equipment coordinates.

Next, the position of each semiconductor device within the tray is determined. In reference to process flow 10, this step is represented as a step 18. Because in most instances standardized tray designs will be used, the position of each device within the tray will be fixed within a range for each different tray design used. These device positions can be stored into the memory of the handling equipment control system, such that the step of determining the device position is simply recalling the positions from memory for the particular design of tray loaded into the handler.

The handling equipment must also know the relative position of an electrical contactor, also referred to herein as a test contactor, which will make electrical contact to the devices while in-tray. Thus, process flow 10 includes a step 20 for determining the relative position of the test contactor. The position of the test contactor can be fixed relative to the handling equipment, or can be calculated or sensed relative to known handling equipment coordinates.

It is noted that the order of steps 16, 18, and 20 is not important for the purposes of practicing the present invention. All that matters is that the handling equipment know the location of the test contactor and the location of the tray cells or the devices within the cells so that proper alignment between the test contactor and the cell or between the test contactor and the device can be made. Thus, steps 16, 18, and 20 could be considered as a single step 21 of determining the needed positions.

Once the needed positions are established, the handling equipment moves the tray, or alternatively the test contactor is moved, so that an initial alignment between the test contactor and the cell or the device within the cell is made. Initial alignment is one in which the cell having the device to be tested is generally brought beneath the test contactor, as indicated in a step 22 of process flow 10. In the initial alignment step, the contactor is not brought into physical contact with either the tray or the device to be tested.

Figure 3:
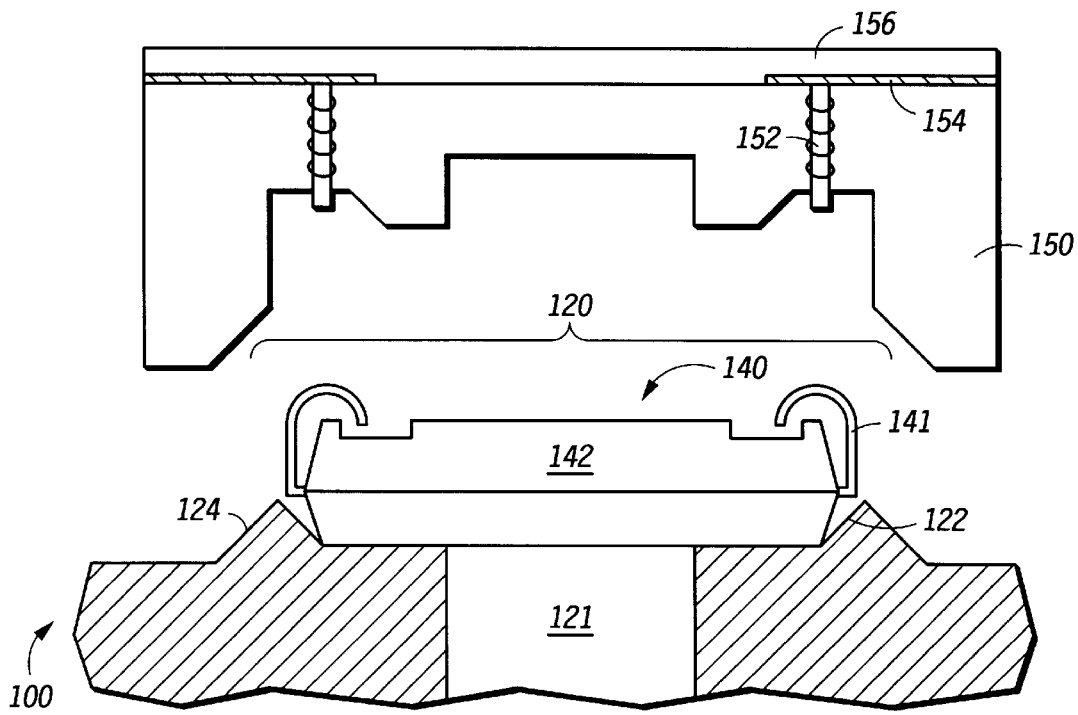
FIG. 3 is a cross-section view of a semiconductor device housed in a tray being initially aligned with a test contactor.

An example of an initial alignment is illustrated in a cross-sectional view in FIG. 3. A semiconductor device 140 having a plurality of leads 141 is positioned in cell 120 of tray 100. Device 140 is illustrated as a PLCC type device, thus it is inverted within the tray cell so that electrical contact to the J-shaped leads can be made. In accordance with a preferred embodiment of the present invention, cell 120 of tray 100 includes a device engagement feature 122, illustrated as a retaining chamfer, which helps to maintain the position of device 140 within the cell (see U.S. Pat. No. 5,492,223 referenced above). The engagement features 122 engage a package body 142 of the device. To make initial alignment of the device for testing, tray 100 is moved horizontally to beneath a test contactor 150 without making physical contact thereto. Test contactor has a plurality of contacts 152, illustrated as pogo-pin type contacts, for contacting leads 141 of the device. Contacts 152 of test contactor 150 are electrically connected to conductive traces 154 on an interface board 156. Interface board 156 serves as the interface between the test contactor 150 and the tester or burn-in controller employed during the testing operation (not illustrated).

After initial alignment is achieved, final alignment between the test contactor and either the tray cell or the device to be tested is made in accordance with a step 24 of process flow 10. In final alignment, the tray is vertically raised (or alternatively the test contactor is vertically lowered) to bring the contacts of the test contactor into physical and electrical contact with the device leads. Precise final alignment of the contacts to the leads is achieved by either aligning the test contactor to the tray cell, aligning the test contactor to the device within the cell, or by a combination of both, as the vertical movement progresses. The vertical progression is stopped by positive contact between the contactor and the semiconductor device, positive contact between the contactor and the cell surface or other tray feature, a force sensing or limiting system, or simply motion control.

Once final alignment is achieved, the contacts of the test contactor will be in both physical and electrical contact with the external leads of the semiconductor device being tested. The device is then electrically exercised by sending electrical signals from a tester to the device via the test contactor contacts and the external leads, as indicated by a step 26 of process flow 10. The electrical signals sent to the device can be those used to perform a partial or full functional test of the semiconductor device, or to simply perform an electrical stress test such as burn-in.

Figure 4:
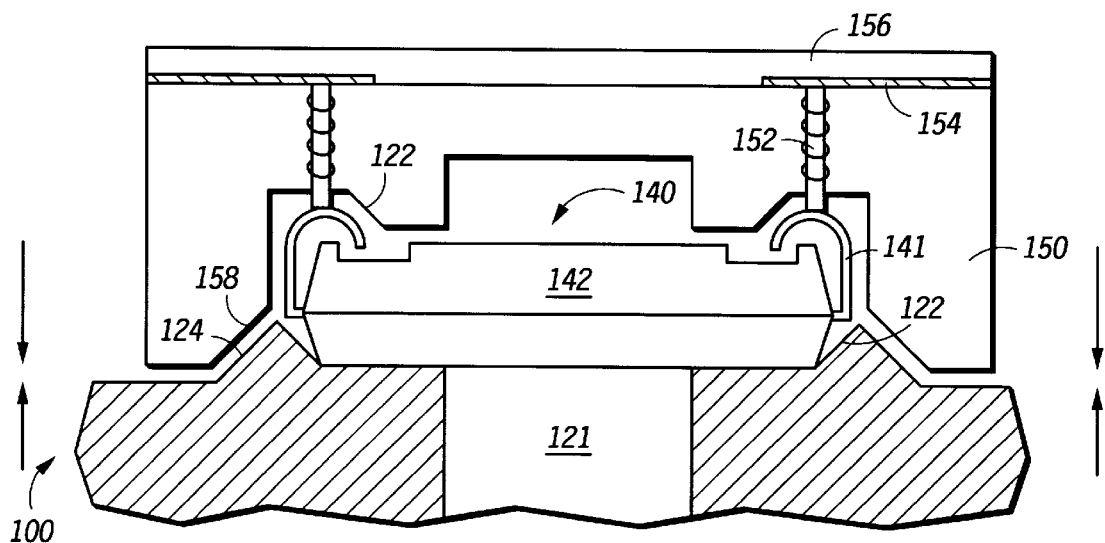
FIG. 4 is a cross-section view of the semiconductor device and test contactor of FIG. 3 after final alignment which utilizes engagement features of the tray and the test contactor.

FIG. 4 illustrates a situation in which a test contactor is finally aligned to a tray cell using the same tray, semiconductor device, and test contactor illustrated previously in FIG. 3. As shown in FIG. 4, the tray is vertically raised (or alternatively the test contactor is vertically lowered) so that a contactor engagement feature 124 of cell 120 engages with a cell engagement feature 158 of the test contactor. In a preferred form, both the contactor engagement feature of the cell and the cell engagement feature of the test contactor are chamfers, one being configured as a male chamfer and the other as a female chamer, each having an angle of 1°–60° measured from vertical. Generally the male chamfer will be 1°–5° less than the female chamfer so that only the narrow end of the male chamfer is in direct contact with the narrowest portion of the female chamfer.

Also in a preferred form, tray 100 has complete freedom of movement in all horizontal directions (X and Y directions) as the tray nears the test contactor so that the cell engagement features of the contactor can be used to move the tray into proper final alignment. For example, if tray 100 were slightly misaligned to test contactor 150 of FIG. 4 during final alignment, a cell engagement feature 158 of the test contactor would initially make physical contact with a plurality of leads along one or more sides of the semiconductor device. If the tray is allowed to move freely, such contact between the cell engagement feature and the device leads will cause the tray to move in a direction such that the cell engagement features will slide off the plurality of leads and ultimately engage with a contactor engagement feature 124 of the cell. Alternatively, the contactor or both the tray handling system and the contactor could be configured to have controlled compliance in the horizontal directions to permit such precise self-alignment of the contactor and the tray cell during the final alignment. Freedom of horizontal movement can be provided by a combination of using frictionless bearings and turning off the torque of the drive mechanism of the tray handler. A preferred method, however, is the utilization of an air-table type environment to provide the freedom of motion which overcomes problems of stiction sometimes associated with the use of frictionless bearings.

In addition to freedom of horizontal movement, it is desirable for there to be a controlled compliance in the vertical direction (Z direction) to accommodate any lack of parallelism between the device, tray, and test contactor, and any lack of coplanarity of the device leads. The extent of controlled vertical compliance can be fulfilled through built-in compliance of the test contacts within the test contactor.

Figure 5:
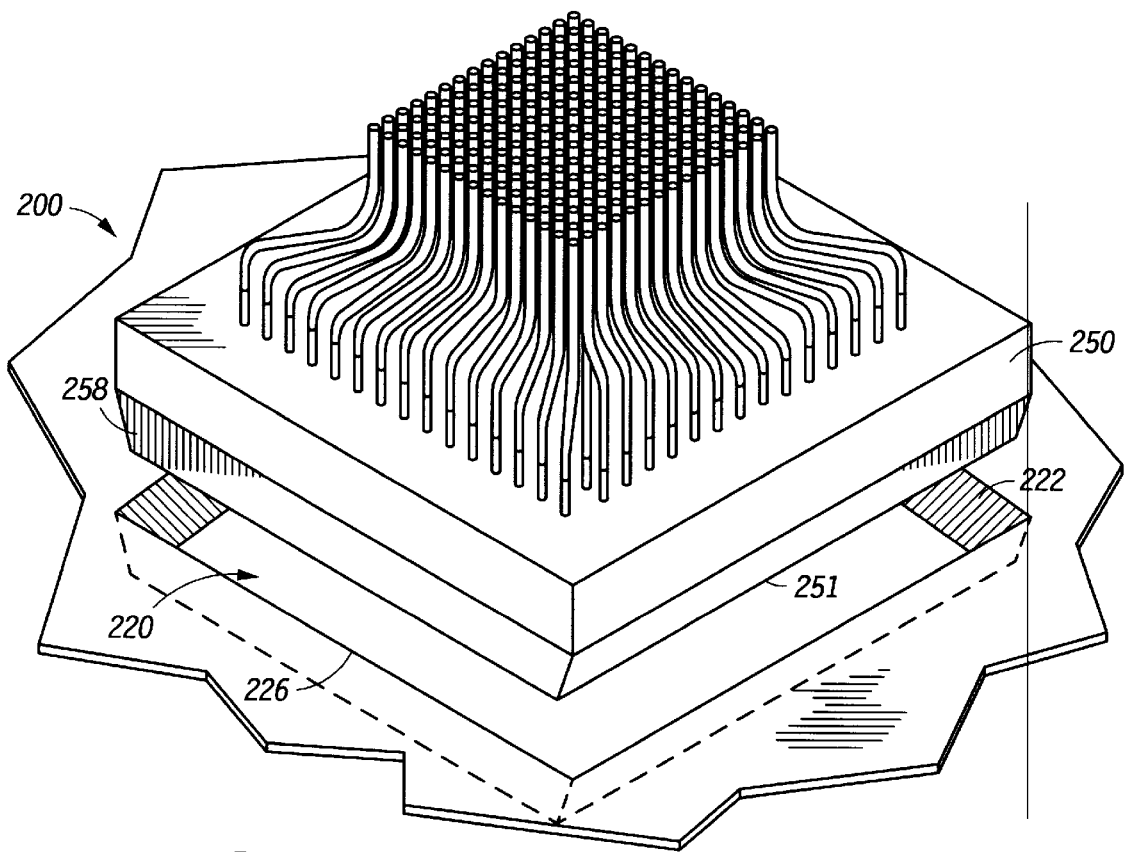
FIG. 5 is a perspective view of how a test contactor engages a tray feature for alignment in accordance with one embodiment of the present invention.

If using the test contactor to engage a tray cell for final alignment, the engagement features of the test contactor are dependent on the specific cell design being used to hold the semiconductor devices. Therefore a variety of suitable contactor designs are envisioned as possible, but only a few are herein illustrated. FIG. 5 illustrates, in a perspective view, another suitable test contactor and tray cell design where engagement of the contactor and the tray cell is used for final alignment. In this embodiment, the engagement feature used to align a packaged semiconductor device within the cell is the same feature used to align the test contactor to the device. A test contactor 250 mates to a cell 220 of a tray 200 in a two step alignment process. An initial alignment substantially positions a lower perimeter 251 of the test contactor completely within the outer perimeter 226 of the tray cell 220. Tray cell 220 includes an engagement feature 222, illustrated as a lead-in chamfer. The chamfer guides both a packaged semiconductor device (not illustrated) and test contactor 250 into cell 220. The test contactor is guided into cell 220 by including an engagement feature 258, also illustrated as a chamfer, which corresponds to that of the cell.

The interior configuration and the extent of engagement features of a test contactor can have a variety of different configurations depending on the specific type of semiconductor device contained within the tray and the tray design. Such interior contactor configurations would serve as the functional equivalent to the chamfer or engagement features described above, namely to align the test contactor to either the tray cell, the semiconductor device, or both during the final alignment step. As illustrated in FIG. 5, engagement feature 258 encircles the entire lower perimeter 251 of the contactor. In other words, in viewing contactor 250 from its bottom surface, the engagement feature would be present around the entire semiconductor device to be tested. Such a configuration is illustrated in FIG. 6, wherein an engagement feature 300 is designed to totally encircle a semiconductor device or cell 310. Advantages associated with a full perimeter engagement feature are maximum contact surface area to minimize local stress between the contactor and the tray cell or semiconductor device, increased contact area to distribute force over the largest possible area of the device or cell edge, and maximum possible angular alignment precision. This configuration also has significant contactor and tray manufacturability advantages when the contactor and tray engagement features need to have small cross sections. The use of full perimeter engagement features would be desirable for trays and contactors designed for semiconductor devices in thin package bodies or packages having soft or fragile edges.

Alternatively, engagement features of a contactor could be designed to engage along only the sides of a device or cell. Such an alternative is illustrated in FIG. 7, wherein four individual engagement feature segments 320 are configured to engage along sides of the semiconductor device or tray cell 310. Stated otherwise, segments 320 are only the center or edge segments of a full perimeter engagement feature, with the corner segments missing. One application where center segmented engaging features would be preferable is for engaging a semiconductor device package which has protuberances (e.g. ears or bumpers) on the corners of the package body, such as in certain plastic quad flat packages (PQFPs). Another application for side engagement features is when the handling tray cells include corner engagement features which might otherwise interfere with the test contactor approach. Use of side engagment features would then provide adequate clearance for contact the device within the tray cell. Advantages associated with this center segmented configuration are minimum contact with the device and tray cell package corners.

In place of side segments, engagement features could be designed to engage only at corners of the device or cell, such as illustrated by corner engagements 330 of FIG. 8. One application where corner engagement features could be implemented is for testing semiconductor devices which have protuberances on the corners of the device, wherein the protuberances are in precise relationship to the device leads. Another application is where there are not corner protuberances on the corners of the device but where there is a precise relationship between the corner leads of the device (see, e.g., FIG. 9) and the remaining device leads. Yet another application is where it is desirable for the engaging feature to not occlude visual or mechanical access to the device leads during testing. An advantage of utilizing a corner engagement configuration is the minimal amount of additional tray or contactor housing material required to provide mating features between the contactor and the tray cells or devices. A second advantage is the minimized contact surface area between the engaging feature of the contactor and the semiconductor device package or tray cell.

As briefly mentioned above, rather than engaging the test contactor with features of the tray cell, the test contactor can instead, or in addition, engage the actual device to be tested. Use of cell-only engagement is possible if the variation or tolerance of the position of the device to be tested within the cell is sufficiently small (e.g. plus or minus one-half the lead width). In such an instance, once the contactor engages the cell, sufficiently aligned physical contact can be made between the test contactor contacts and the device leads. However, more often than not the window for device position within a cell will be greater than one-half the lead width. Accordingly, there is a need to also or instead design the test contactor to engage in some feature of the device to be tested.

FIG. 9 illustrates in a perspective view how corner engagement features 430 can be used to engage corners of a semiconductor device 410, either in place of engaging a device cell or in addition thereto. For the sake of clarity, the tray which would hold the semiconductor device is not illustrated in this view. Likewise, the entire remaining portions of the test contractor itself are not shown since it is apparent how corner segments 430 could be integrated into a test contactor as engagement features such as those previously described. Only two corner engagement features are illustrated, but four such segments could be used in practice. The illustrated device is a QFP device, and more particularly a QFP device wherein the distance from a corner lead to another corner lead on the same side of the device (represented as X1 and X2) is tightly controlled. As such, a test contactor can be designed to self-align to the device package leads 414. The corner segments are made to precisely fall between the tightly controlled corner lead locations. In some instances, the relationship between the package body and the device leads is so tightly controlled that the package body itself can be used for test contactor alignment. For instance, corner segments 430 could engage package body 412, leading to adequate test contact to device lead alignment. Once the device and test contactor are aligned using the corner segments 430 of the test contactor, either through alignment with the package or with the leads (or a combination of both) proper electrical connection between the device leads 414 and the test contactor contacts can be made.

In the most likely scenario, a combination of engagement features incorporated into the test contactor to engage both the tray cell and the device to be tested will be used. The alignment of the test contactor to the tray cell will be more precise than that achievable by the initial alignment, but because there is generally too large of a variation of a device's position within a tray cell further precision is needed. Embodiments where both device and cell engagement features are included in a test contactor are demonstrated in FIGS. 10–15.

Figure 10:
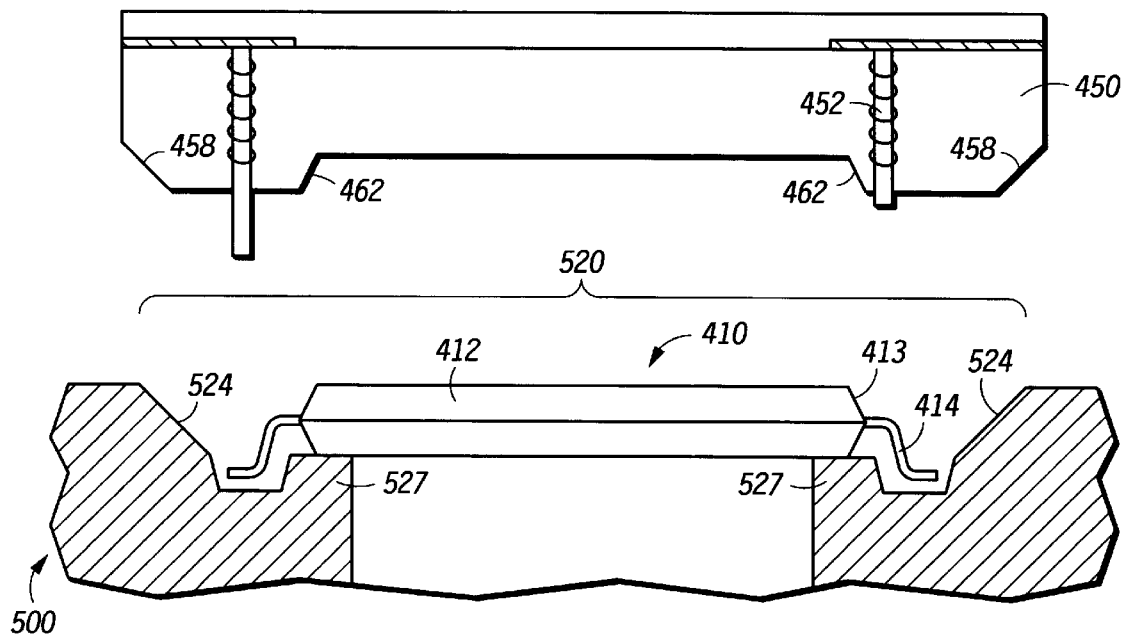
FIGS. 10–11 illustrate in a cross-sectional views a semiconductor device being engaged by a test contactor, and how electrical contact can be made to the device in accordance with the present invention.
Figure 11:
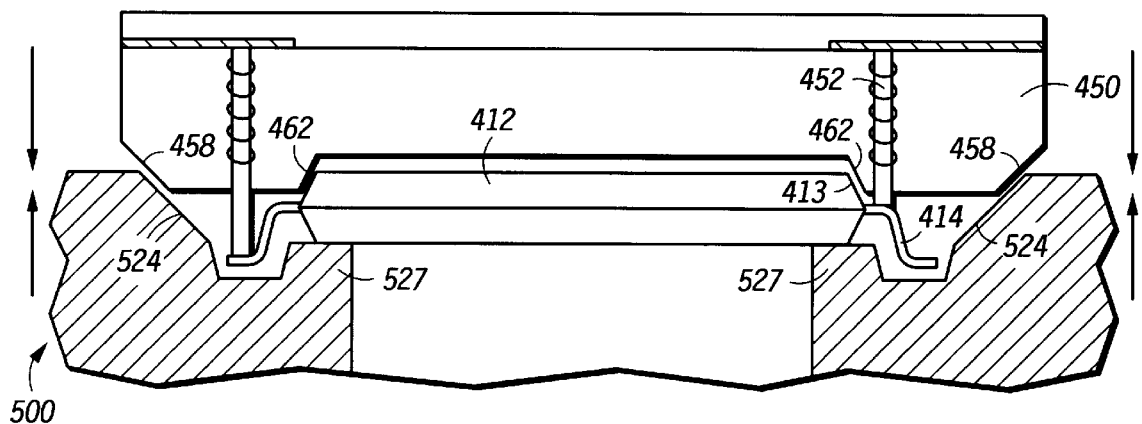

FIGS. 10–11 illustrate in cross-sectional views a test contactor 450 which can be used to test a QFP semiconductor device 410 using both cell engagement features 458 and device engagement features 462. In an initial alignment step, a device carrying tray 500 or test contactor 450 is moved to bring a semiconductor device 410 into general alignment with the test contactor, for example using known tray edge and cell reference coordinates, as shown in FIG. 10. In a final, more precise alignment, cell engagement features 458 of the contactor engage contactor engagement features 524 of a cell 520 of the tray, as in previously described embodiments and as shown in FIG. 11. In addition, device engagement features 462 engage with tapered sidewalls 413 of a package body 412 of the device. This second level of final contactor alignment is particularly useful when the tray cell does not itself have features for engaging the device package body. For example, as illustrated in FIG. 10, tray 500 merely has a pedestal portion 527 on which device 410 rests, without there being any particular feature of the cell to engage package body 412. The extent of device movement permitted with use of pedestal portion 527 will be governed by the pedestal width as compared to the span between the leads on opposing device sides. To prevent damage to leads, the leeway for device movement is likely to be high. Therefore, to permit such a tray design while still enabling in-tray testing, a test contactor is designed to include device engagement features such as those illustrated.

The tray and contactor illustrated in FIGS. 10–11 also illustrate some features of the present invention not previously described. Device 410 has a gull-wing lead configuration as is standard for most QFP devices. Due to the lead configuration, there is no need to invert the device to enable electrical connection between the test contactor contacts (illustrated as pogo-pin type contacts 452). Furthermore, as illustrated, contact between the test contactor contacts and the device leads can occur anywhere along the lead. Preferably contact is made to a surface of the lead which is as close to perpendicular to the test contactor contacts as possible. For instance, as illustrated in the left half of FIG. 11, a pogo-pin makes contact to the foot of the lead, while in the right half of the figure a pogo-pin makes contact to the shoulder of the lead.

Figure 12:
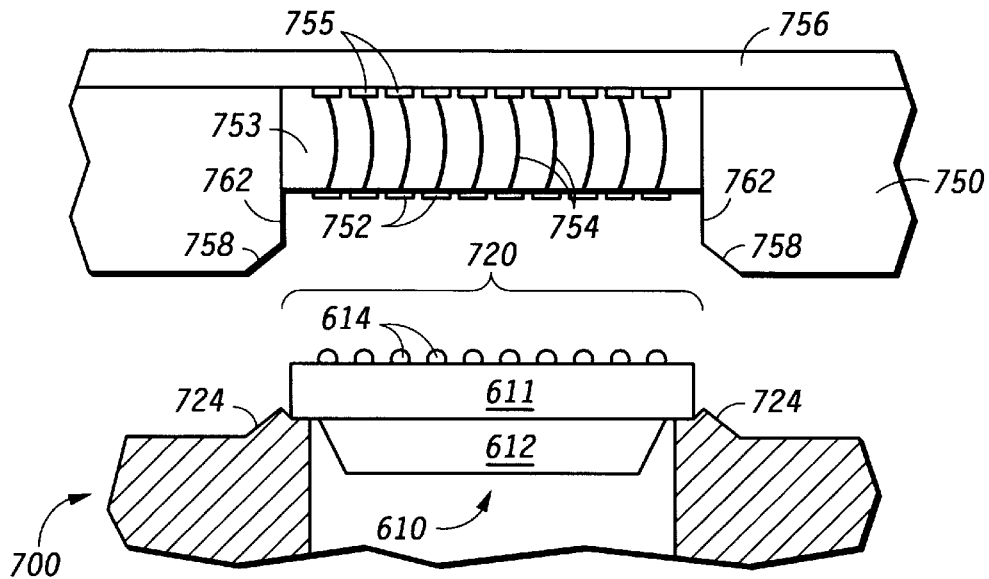
FIG. 12 illustrates in a cross-sectional view a ball grid array (BGA) semiconductor device which is electrically contacted by a test contactor by engaging a substrate of the device in accordance with one embodiment of the present invention.

FIG. 12 illustrates a test contactor and tray configuration in accordance with the present invention for use in in-tray testing BGA type semiconductor devices. A BGA semiconductor device 610 is positioned in a cell 720 of a shipping tray 700. Device 610 includes a substrate 611 having an overmolded package body 612 formed on one side thereof. On an opposing side of the substrate is a plurality of device leads 614 in the form of solder balls. A test contactor 750 includes cell engagement features 758 for mating with contactor engagement features 724 of cell 720 during final alignment. Test contactor 750 also includes device engagement features 762 which mate with substrate 611 during final alignment. Once final alignment is achieved, the contacts of the test contactor are in physical and electrical contact with the device leads. In reference to FIG. 12, a plurality of contacts 752 in the form of contactor pads are brought into contact with the solder balls of the device. As illustrated, the contactor pads are part of an elastomer material 753 substrate which provides electrical connection between the contacts device being tested and an interface board 756. Contact between the device and interface board is made through holes in an elastomer base material filled with a conductive material such as gold wire 754 or a conductive elastomer material. The conductive portions of the elastomer are connected to contact pads 755 on interface board 756. This does not imply that BGA devices can only be tested using an elastomer substrate as part of the test contactor. Conventional pogo-pins or other contacting mechanisms can likewise be used with BGA devices, as evidenced below.

Figure 13:
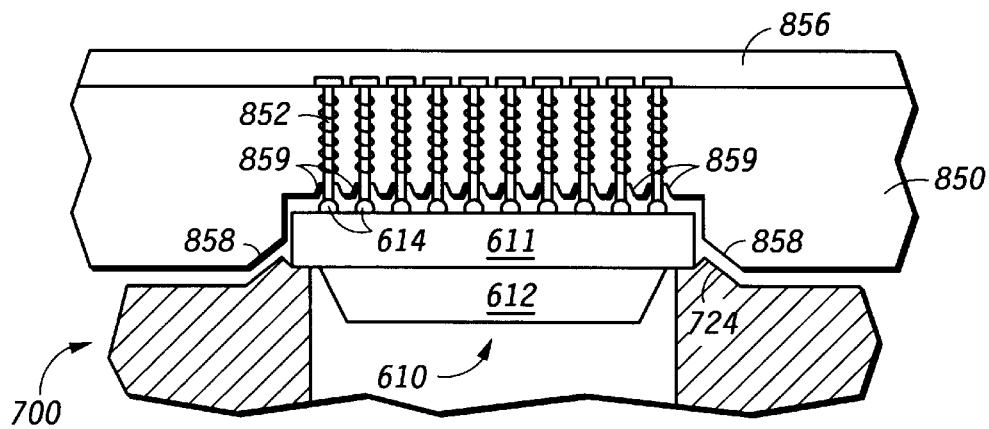
FIG. 13 illustrates the BGA semiconductor device of FIG. 12, wherein engagement is made using the solder balls of the device rather than, or in addition to, engagement of the device substrate.

An alternative method for providing device engagement features in a test contactor for BGA devices is depicted in FIG. 13. Rather than designing a test contactor to include features which engage the BGA substrate, the contactor could include features which engage the solder balls. For instance, illustrated in FIG. 13 is a test contactor 850 having a plurality of cone or pyramid shaped solder ball engagement features 859, one for each solder ball of the device. During final alignment, the chamfered edges of engagement features 859 engage the solder balls to self-align the device to the contacts of the test contactor. Also included in test contactor 850 are cell engagement features 858 for engaging cell 720, for in a preferred embodiment the test contactor engages both the device and the tray cell. As shown in FIG. 11, pogo-pin type contacts 852 are used to make the electrical connections to the device terminals for testing or burn-in of the device. These contacts are routed to a tester through an interface board 856.

Figure 14:
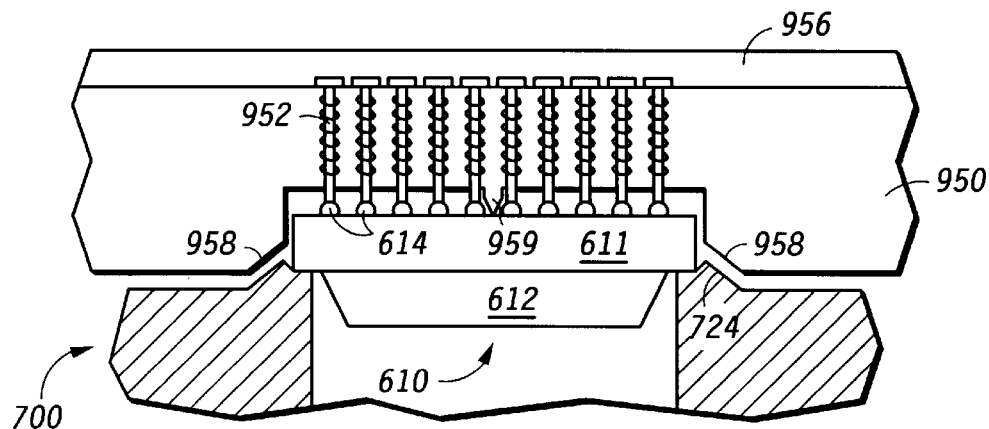
FIG. 14 illustrates an alternative way of engaging the solder balls of the BGA device of FIG. 13, wherein a blade-like engagement feature is aligned to the centerlines of the solder ball pattern of the device.

Yet another method for providing device engagement features in a test contactor for BGA devices using engagement with the solder balls is depicted in FIG. 14. In this embodiment, a test contactor 950 includes a blade-like engagement feature 959 which engages a select group of the solder balls or leads 614 of BGA device 610, rather than having an engagement feature for each solder ball or for engaging the device substrate. More specifically, blade-like engagement feature 959 engages those solder balls adjacent to the centerlines of the solder ball pattern. For example, in reference to FIG. 15 which illustrates the bottom of BGA device 610 and the bottom of the test contactor, substrate 611 of the device has a centerline 617 and a centerline 619. Blade-like engagement feature 959 is integrated into test contactor 950 in a position corresponding to centerlines 617 and 619. To enable electrical contact to be made to all of the solder balls, the blade-like engagement feature must not obstruct physical access to any of the solder balls needed during test. For instance, as shown in FIG. 15, blade-like engagement feature 959 is positioned between adjacent rows of contacts 952, illustrated as pogo-pin type contacts which are coupled to interface board 956.

Blade-like engagement feature 959 includes a beveled or tapered edge. Thus, alignment of the test contactor to the device after initial alignment can be off by as much as one-half the solder ball pitch. During final alignment, the beveled or tapered edge of the engagement feature is used to bring the device into its final alignment position. For instance, tray 700 is allowed complete freedom of movement in the horizontal directions during final alignment such that the beveled or tapered edges will physically contact one or more solder balls adjacent to the centerlines of the device if the initial alignment is slightly off. Upon physical contact with the balls, the blade-like engagement feature will wedge itself into proper position at the device centerlines by sliding along the solder balls during the last stages of vertical movement of either the tray or test contactor. As further assurance for proper final alignment, the test contactor may also include cell engagement features 958 for mating the corresponding contactor engagement features 724 of the tray.

Figure 15:
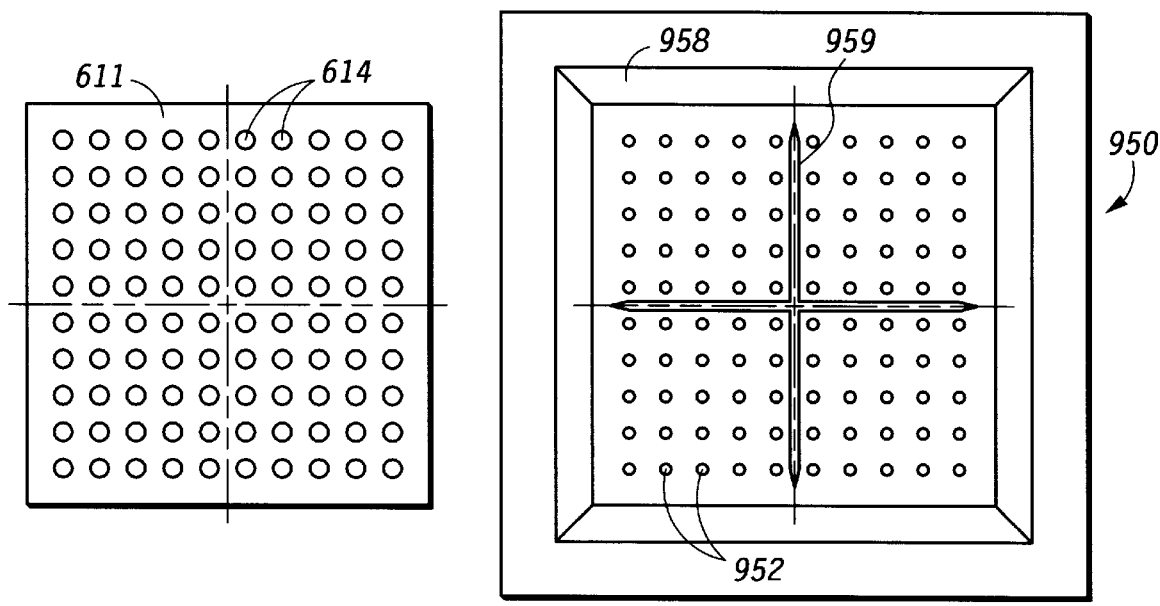
FIG. 15 illustrates the manner in which the blade-like engagement feature of FIG. 14 is integrated into a test contactor and aligns to the solder pattern of the BGA device.
Figure 16:
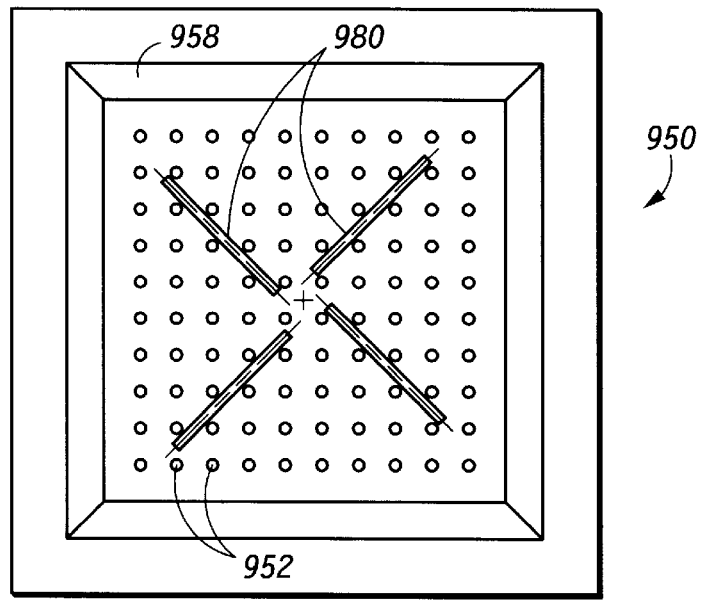
FIG. 16 illustrates an alternative embodiment wherein a plurality of blade-like engagement features are used to align to a solder ball pattern of a BGA device in accorance with the invention.

A blade-like engagement feature for engaging solder balls or other array terminals, if used, need not be in the form of a cross-hair as illustrated in FIG. 15. Another suitable configuration is illustrated in FIG. 16, which includes a plurality of separated solder ball engagement features 980. The offset segments illustrated in FIG. 16 are advantageous in that a single standard contactor design can be used for a given solder ball pitch. Further, the alignment accuracy can be more precise than if using a cross-hair configuration.

Many advantages are associated with using the above described test contactors in conjunction with handling and shipping trays. It is possible to test and burn-in semiconductor devices without having to remove them from the trays. Accordingly, manufacturing cycle time is reduced by eliminating pick and place operations during testing. Furthermore, the potential for lead damage is minimized, thereby improving yields. While the present in-tray testing methodology is particularly suitable for use with trays having built-in engagement features, an attractive aspect of the invention is that conventional trays without such features can also be used for in-tray testing. In addition, the use of in-tray testing in accordance with the invention greatly reduces complexity of handling mechanisms, with attendant savings in maintainence, set-up, and acquisition costs of such equipment.

Thus it is apparent that there has been provided, in accordance with the invention, a method for electrically contacting semiconductor devices in-tray and a test contactor useful therefor that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, the location, size, or shape of an engagement feature incorporated into a test contactor is not restricted by the present invention. All that is needed is that contactor have some physical feature which engages with either the tray or the device to be tested to provide sufficient final alignment. Nor is the invention is limited to using test contactors which contact or test only one device at a time. The contactors may be ganged together to permit the testing or burn-in of multiple semiconductor devices simultaneously. The only known limitations on how many devices may be tested or burned-in in parallel are the physical constraints imposed by the spacing between the centers of the cells in the tray matrix and the functional capacity of existing testers. Thus, parallel testing of an entire tray of devices may be possible depending on the size of the devices. Existing burn-in drive technology is capable of handling full tray quantities of devices, so the only constraint is the cell spacing. It is also important to note that the present invention can be enhanced by the addition of a built-in feed-back control system which helps determine if adequate alignment has been achieved. Furthermore, alignment may be facilitated by the addition of vibration. Other variations within the scope of the invention include the use of active alignment features in the test contactors (e.g. mechanisms that move during the alignment operation, such as by opening and closing), and the use of floating or spring-loaded alignment features to accomodate variations in device, tray cell, or feature size. Therefore, it is intended that this invention encompass all such variations and modifications as fall within the scope of the appended claims.

We claim:

1. A method for electrically contacting a plurality of semiconductor devices while in a handling tray comprising the steps of:

providing the handling tray having a plurality of device cells arranged in a matrix configuration;

providing the plurality of semiconductor devices, each semiconductor device having a plurality of external leads arranged in a lead configuration;

positioning the plurality of semiconductor devices into the plurality of device cells of the handling tray;

providing a test contactor having a plurality of contacts arranged in a configuration which matches the lead configuration, said test contactor having an engagement feature comprising a chamfer having an inclined surface;

bringing the plurality of contacts of the test contactor into contact with the plurality of external leads associated with at least one semiconductor device of the plurality of semiconductor devices while said at least one semiconductor device is within its associated device cell of the handling tray, wherein the step of bringing comprises moving at least one of the test contactor and the handling tray along a vertical direction so as to engage the chamfer of the test contactor with a complementary chamfer of at least one of the handling tray and the at least one semiconductor device, said complementary chamfer having a complementary inclined surface, wherein the inclined surface and the complementary inclined surface are inclined with respect to the vertical direction; and electrically exercising said at least one semiconductor device by transmitting electrical signals thereto via the plurality of contacts and the plurality of external leads while said at least one semiconductor device is within its associated device cell of the handling tray.

2. The method of claim 1 wherein the step of providing the handling tray comprises providing the handling tray wherein each device cell has the engagement feature.

3. The method of claim 2 wherein the handling tray includes the complementary chamfer.

4. The method of claim 1 wherein said at least one semiconductor device includes the complementary chamfer.

5. The method of claim 4 wherein the complementary chamfer extends along a package body of said at least one semiconductor device.

6. The method of claim 4 wherein the step of bringing further comprises having the device engagement feature of the test contactor engage at least one lead of the plurality of external leads of said at least one semiconductor device.

7. The method of claim 1 wherein the engagement feature comprises first and second engagement features respective having first and second chamfers, the complementary chamfer comprises first and second complementary chamfers, the handling tray having the first complementary chamfer and the semiconductor device having the second complementary chamfer, and the first and second chamfers respectively engage the first and second complementary chamfers.

8. The method of claim 1 wherein the step of electrically exercising comprises performing a functional test of said at least one semiconductor device.

9. The method of claim 1 wherein the step of electrically exercising comprises burning-in said at least one semiconductor device.

10. The method of claim 1 wherein the step of providing a test contactor comprises providing a test contactor having a lead engagement feature, and wherein the step of bringing further comprises having the lead engagement feature of the test contactor engage at least one lead of the plurality of external leads.

11. A method for electrically contacting a plurality of semiconductor devices while in a handling tray comprising the steps of:

providing the handling tray having a plurality of device cells arranged in a matrix configuration;

providing the plurality of semiconductor devices, each semiconductor device having a plurality of external leads arranged in a lead configuration;

positioning the plurality of semiconductor devices into the plurality of device cells of the handling tray;

providing a test contactor having a plurality of contacts arranged in a configuration which matches the lead configuration, said test contactor having an engagement feature comprising a chamfer having an inclined surface;

determining relative positions of the handling tray, at least one semiconductor device of the plurality of semiconductor devices and the test contactor;

bringing the plurality of contacts of the test contactor into contact with the plurality of external leads associated with the at least one semiconductor device while said at least one semiconductor device is within its associated device cell of the handling tray, wherein the step of bringing comprises moving at least one of the test contactor and the handling tray along a vertical direction so as to engage the chamfer of the test contactor with a complementary chamfer of at least one of the handling tray and the at least one semiconductor device, said complementary chamfer having a complementary inclined surface, wherein the inclined surface and the complementary inclined surface are inclined with respect to the vertical direction; and electrically exercising said at least one semiconductor device by transmitting electrical signals thereto via the plurality of contacts and the plurality of external leads while said at least one semiconductor device is within its associated device cell of the handling tray.

12. The method of claim 11, further comprising steps of performing an initial alignment by positioning at least one of the handling tray and the test contactor so that said associated device cell is generally aligned under the test contactor, wherein the step of performing the initial alignment is carried out after the step of determining relative positions of the handling tray, at least one semiconductor device of the plurality of semiconductor devices and the test contactor.

13. The method of claim 11 wherein the step of providing the handling tray comprises providing the handling tray wherein each device cell has the engagement feature.

14. The method of claim 13 wherein the handling tray includes the complementary chamfer.

15. The method of claim 11 wherein said at least one semiconductor device includes the complementary chamfer.

16. The method of claim 15 wherein the complementary chamfer extends along a package body of said at least one semiconductor device.

17. The method of claim 15 wherein the step of bringing further comprises having the device engagement feature of the test contactor engage at least one lead of the plurality of external leads of said at least one semiconductor device.

18. The method of claim 11 wherein the engagement feature comprises first and second engagement features respectively having first and second chamfers, the complementary chamfer comprises first and second complementary chamfers, the handling tray having the first complementary chamfer and the semiconductor device having the second complementary chamfer, and the first and second chamfers respectively engage the first and second complementary chamfers.

19. The method of claim 11 wherein the step of electrically exercising comprises performing a functional test of said at least one semiconductor device.

20. The method of claim 11 wherein the step of electrically exercising comprises burning-in said at least one semiconductor device.

21. The method of claim 11 wherein the step of providing a test contactor comprises providing a test contactor having a lead engagement feature, and wherein the step of bringing further comprises having the lead engagement feature of the test contactor engage at least one lead of the plurality of external leads.

* * * * *